United States Patent [19]

Armitage

[11] Patent Number: 4,504,741
[45] Date of Patent: Mar. 12, 1985

[54] DIGITAL CIRCUIT FOR GENERATING ASCENDING OR DESCENDING RAMP-LIKE WAVEFORMS

[75] Inventor: Scott T. Armitage, Minnetonka, Minn.

[73] Assignee: Rockwell International Corporation, El Segundo, Calif.

[21] Appl. No.: 413,094

[22] Filed: Aug. 30, 1982

[51] Int. Cl.³ .................. H03K 4/06; H03K 4/02; H03K 21/10
[52] U.S. Cl. .................. 307/228; 307/261; 307/227; 328/14; 328/186; 377/45
[58] Field of Search .............. 307/227, 228, 261; 328/14, 184, 186; 377/39, 45

[56] References Cited

U.S. PATENT DOCUMENTS

| | | | |
|---|---|---|---|
| 3,628,061 | 12/1971 | Jackman | 328/186 X |
| 3,657,657 | 4/1972 | Jefferson | 328/186 X |
| 4,276,468 | 6/1981 | Nagamoto et al. | 377/39 X |
| 4,284,979 | 8/1981 | Flanders et al. | 377/39 X |
| 4,342,007 | 7/1982 | Elliott | 328/184 X |
| 4,349,789 | 9/1982 | Kurihara | 307/228 X |

*Primary Examiner*—Stanley D. Miller
*Assistant Examiner*—D. R. Hudspeth
*Attorney, Agent, or Firm*—Terry M. Blackwood; George A. Montanye; H. Fredrick Hamann

[57] ABSTRACT

Digital apparatus receives digital data and outputs a ramp-like analog waveform. The digital apparatus comprises a reference digital word source, a variable digital word source, a testing circuit, and a D/A converter. The reference word and the variable word are tested for a predetermined relationship and the variable word changes until the predetermined relationship or condition is satisfied. The D/A converter receives the variable word and converts changes in same into either positive or negative slope ramps. The D/A converter output is constant during intervals where the variable word is not changing.

3 Claims, 2 Drawing Figures

DIGITAL CIRCUIT FOR GENERATING ASCENDING OR DESCENDING RAMP-LIKE WAVEFORMS

This invention relates to digital generation of ramp-like waveforms.

Analog ramp generators typically manifest certain limitations such as imprecise starting and stopping of the ramp, imprecise linearity of the ramp, and/or drooping of the start and stop levels.

Figure 1:
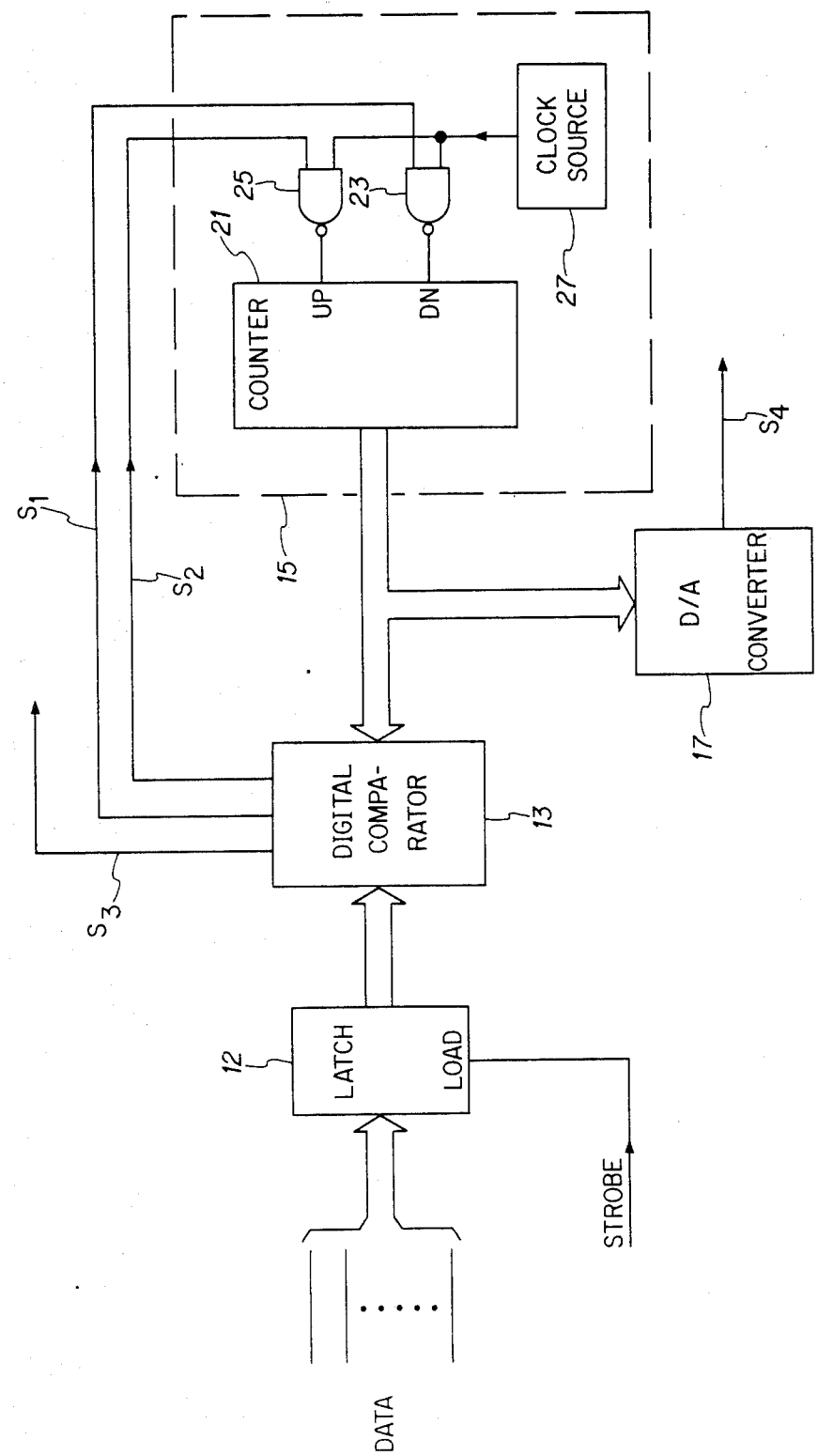
Figure 2:
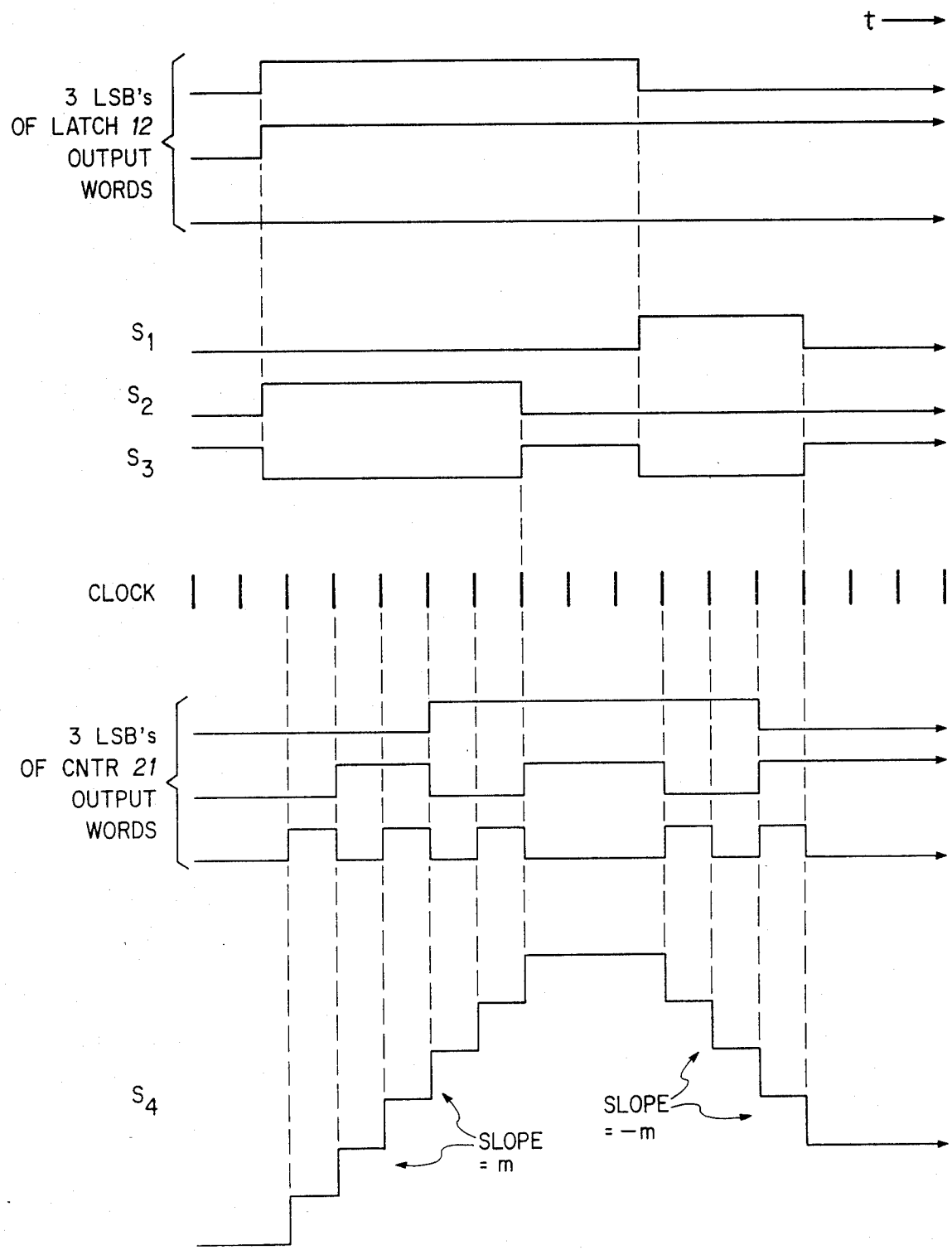

In accordance with the present invention, digital ramp generator apparatus provides ramps of controlled length and constant rate, and overcomes many of the deficiencies associated with prior art ramp generators. These and other features, aspects, and advantages will become more apparent upon reference to the following specification, claims, and appended drawings in which:

FIG. 1 is a block diagram schematic representing the presently preferred inventive embodiment, and FIG. 2 shows waveforms useful in explaining the operation of the FIG. 1 apparatus.

Referring now to FIG. 1, the circuit therein represented comprises a latch 12, a digital comparator 13, a controllable digital word generator 15, and a digital-to-analog (D/A) converter 17. In the preferred embodiment, latch 12 is a ten bit latch and receives parallel-bit digital data from a ten line data bus. At each occurrence of a strobe signal, the then present input data is loaded into latch 12, and latch 12, in turn, outputs this data or digital word to ten bit digital comparator 13. Latch 12 serves as a temporary memory for maintaining as output to digital comparator 13 the same reference digital word until a new reference digital word is loaded into latch 12. Also received by comparator 13 is the output provided by controllable word generator 15. Word generator 15 comprises a ten bit up-down counter 21, steering logic gates 23 and 25, and constant pulse rate clock source 27. Generator 15 is capable of providing $2^{10}$ different parallel-bit digital words and may be thought of as providing a variable digital word.

Comparator output signals $S_1$ and $S_2$ are connected to inputs of gates 23 and 25 respectively, and control the output of counter 21 by steering the clock signal to one, or the other, or neither, of the counter 21 UP and DN inputs. When the latch output word becomes greater than the counter output word, signal $S_2$ goes high, enables gate 25, and permits the clock pulses to appear at the UP input. Counter 21 will thus count ascendingly and the counter output will increment one least significant bit (LSB) per clock pulse.

When the latch output word becomes less than the counter output word, signal $S_1$ goes high, enables gate 23, and permits the clock signal to appear at the DN input. Counter 21 will thus count descendingly and the counter output will decrement one least significant bit (LSB) per clock pulse. When the latch output word and the counter output word are equal to one another, signals $S_2$ and $S_1$ will both be low, neither the UP nor DN input will receive any clock pulses, and the counter output word will cease to change or vary. Also, when the comparator input words are equal to one another, signal $S_3$ is high; when the comparator input words are not equal to one another, $S_3$ is low.

The ten bit output of counter 21 is also connected to the ten parallel-bit input of D/A converter 17. For each increment in the counter output, the D/A converter analog output signal $S_4$ increases in amplitude by one unit. For each decrement in the output of counter 21, $S_4$ decreases one unit. When the output of counter 21 is not changing, $S_4$ remains constant at the last achieved amplitude level until the counter output again begins to change.

As has been implemented, latch 12 may comprise an appropriately interconnected pair of six-bit circuits each of which is a 54LS174; comparator 13 may comprise three appropriately interconnected four-bit circuits each of which is a 54LS85; up-down counter 21 may comprise three appropriately interconnected four-bit circuits each of which is 54LS193; D/A converter 17 may comprise a circuit which is a MC3410; and a conventional op-amp circuit may be used at the output of the MC3410 to provide some low-pass filtering and/or gain.

Turning now to FIG. 2, FIG. 1 circuit waveforms are illustrated for a simple but representative example of operation. In the selected example, it is assumed, for the purpose of brevity and simplicity, that the seven most significant bits of input data remain constant throughout the FIG. 2 illustrated time period. Thus, only the three least significant bits of the latch output, and only the three least significant bits of the counter ouput, are illustrated in FIG. 2. It is further assumed that, during the first illustrated clock interval, the three least significant bits of the latch are equal to the three least significant bits of the counter, and are assigned the value 000. During the second illustrated clock interval, the three least significant bits of the latch change to 110, and, since the three least significant bits of the counter are still 000 at this point of latch change, $S_2$ goes high (indicating that the latch word is greater than the counter word) and $S_3$ goes low (indicating that the two words are no longer equal). At the clock pulse following this latch word change, counter 21, with its UP input now permitted to receive the clock pulses, increments its output by one count (i.e., one least significant bit), and the counter word changes to 001. Since the latch word is still greater, $S_2$ remains high and $S_3$ remains low. At the next succeeding clock pulses, namely, the fourth, fifth, sixth, and seventh clock pulses, the counter output word changes to, respectively, 010, 011, 100, and 101.

At the eighth illustrated clock pulse, the counter output word changes to 110 and, since, the condition of word equality is restored, $S_2$ returns to a low state and $S_3$ returns to a high state.

For each of the counter output increments, the D/A converter output $S_4$ increases in amplitude by one unit.

For the intervals following the eighth and ninth illustrated clock pulses, the three least significant bits of the latch still remain at 110, and thus during these intervals there are no changes in the counter word or in $S_1$, $S_2$, $S_3$, or $S_4$.

During the clock interval following the tenth clock pulse, the three least significant bits of the latch change to 010, and, since the three least significant bits of the counter are still 110 at this point of latch change, $S_1$ goes high (indicating that the latch word is less than the counter word) and $S_3$ goes low (indicating that the two words are no longer equal). At the clock pulse following this latch word change, counter 21, with its DN input now permitted to receive the clock pulses, decrements its output by one count (i.e., one least signficant bit) and the counter word changes to 101. Since the latch word is still less, $S_1$ remains high and $S_3$ remains low. At the next succeeding clock pulses, namely, the twelfth and thirteenth clock pulses, the counter output word changes to, respectively, 100, and 011.

At the fourteenth illustrated clock pulse, the counter output word changes to 010 and, since, the condition of word equality is restored, $S_1$ returns to a low state and $S_3$ returns to a high state.

For each of the counter output decrements, the D/A converter output $S_4$ decreases in amplitude by one unit.

For the intervals following the fourteenth, fifteenth, and sixteenth clock pulses, the three least significant bits of the latch still remain at 010, and thus during these intervals there are no changes in the counter word or in $S_1$, $S_2$, $S_3$, or $S_4$.

The FIG. 1 circuit output waveform $S_4$ is a ramp-like waveform. The stairstepped ramp portions occur while the compared words are unequal and the counter output is changing. The constant level portions occur during intervals where the two compared words are equal and the counter output is not changing. The $S_4$ waveform can ramp up or ramp down and the value m of the slope (i.e., rate) is constant and precise. Also, the length of each up or down ramp is precise and faithfully corresponds to the amount of reference word change, i.e., latch output change.

As mentioned hereinabove, D/A converter 17 may employ some low-pass filtering to smooth out the stairstep waveform illustrated in FIG. 2.

Also, although in the preferred embodiment the digital comparator tests for equality of words, equality need not be the condition for which testing is satisfied. Also, the data, the strobe signal, and/or the clock source may be synchronized with one another.

Thus, while various embodiments of the present invention have been shown and/or described, it is apparent that changes and modifications may be made therein without departing from the invention in its broader aspects. The aim of the appended claims, therefore, is to cover all such changes and modifications as fall within the true spirit and scope of the invention.

What is claimed is:

1. Digital apparatus for generating ramp-like waveforms comprising:
   memory first means for receiving digital data input to the waveform generating apparatus and, in response thereto, providing as output a reference digital word,
   second means for generating and providing as output a variable digital word, said second means being controllable so that said variable digital word may change ascendingly, descendingly, or not at all, said second means comprising a source of constant frequency clock signals and an up-down counter means for providing said variable digital word, the counter means output incrementing a predetermined number of bits per clock signal while a first predetermined relationship exists between the variable digital word and the reference word, the counter means output decrementing a predetermined number of bits per clock signal while a second predetermined relationship exists between the variable digital word and the reference word, and the counter means output not changing while a third predetermined relationship exists between the two words,
   third means for receiving and testing said reference and variable digital words and for commanding said second means to change said variable digital word until said third predetermined relationship between said reference and variable words is achieved, and then to cease changing until a new reference word is provided by said first means, and
   fourth means connected for receiving the second means output and comprising digital to analog converter means, said fourth means outputting ramp-like waveforms in response to changes in said variable digital word.

2. Digital apparatus for generating ramp-like waveforms comprising:
   first means for receiving digital data input to the waveform generator apparatus and for at least temporarily storing, and providing as output, a digital word corresponding to the input data,
   clock source second means for providing clock signals occurring at a constant frequency,
   controllable reversible counter third means having a plural bit output which is controllable so as to either (a) not change as the clock signals occur, or (b) increment a predetermined number of counts per clock signal, or (c) decrement a predetermined number of counts per clock signal,
   digital comparator fourth means for receiving and comparing said first means output and said third means output and for commanding the third means to do one of (a) or (b) or (c) as a result of the comparison, and
   fifth means connected to the third means output and comprising digital to analog converter means, whereby changes in said third means output are converted into ramp-like analog signals.

3. Apparatus as defined in claim 2 wherein said third means is caused to do (a) when said first means output is equal to said third means output, is caused to do (b) when said first means ouput is a predetermined one of greater or less than the third means output, and is caused to do (c) when said first means output is the other one of greater or less than the third means output.

* * * * *